United States Patent [19]

Reiner et al.

[11] 4,329,640
[45] May 11, 1982

[54] VERY LARGE SCALE INTEGRATED CIRCUIT

[75] Inventors: Hans Reiner, Gerlingen; Werner Auth, Stuttgart, both of Fed. Rep. of Germany

[73] Assignee: ITT Industries, Incorporated, New York, N.Y.

[21] Appl. No.: 42,181

[22] Filed: May 24, 1979

[30] Foreign Application Priority Data

Jun. 2, 1978 [DE] Fed. Rep. of Germany ....... 2824224
Feb. 9, 1979 [DE] Fed. Rep. of Germany ....... 2904874

[51] Int. Cl.³ .......................................... G01R 15/12
[52] U.S. Cl. ............................. 324/73 R; 324/73 AT; 371/21
[58] Field of Search ........... 324/73 AT, 73 R, 73 PC; 371/21; 364/580; 307/213, 303

[56] References Cited

U.S. PATENT DOCUMENTS 3,961,251 6/1976 Hurley ........................... 324/73 AT
3,961,252 6/1976 Eichelberger ................. 324/73 AT
4,139,818 2/1979 Schneider .......................... 324/73 R

OTHER PUBLICATIONS

S. D. Kelley, Imbedded Memory Test Methods, IBM Tech. Disc. Bull., vol. 21, No. 12, May 1979, pp. 4911-4913.
R. E. Bodner, Generation of Internal Test Signals, IBM Tech. Disc. Bull., vol. 17, No. 8, Jan. 1975, pp. 2396-2397.

Primary Examiner—Michael J. Tokar
Attorney, Agent, or Firm—John T. O'Halloran; Peter R. Ruzek

[57] ABSTRACT

A monolithically very large scale integrated circuit (VLSI) having any arbitrarily given structure and an internal test circuit only requiring one, two or three additional outer terminals wherein the test circuit is integrated therein. In one embodiment the test circuit contains a counter and a combinational circuit interconnected with the counter reading outputs thereof as well as selection switches associated with test points and where the first of the additional terminals is connected to the counting input of the counter.

12 Claims, 8 Drawing Figures

VERY LARGE SCALE INTEGRATED CIRCUIT

BACKGROUND OF THE INVENTION

This invention relates in general to very large scale integrated circuits and more particularly to a VLSI circuit having a monolithically integrated test circuit therein.

In monolithically integrated circuits both the manufacturing costs per semiconducting crystal and the reliability are substantially determined by the number of outer terminals (pads). Since in digital circuits with an irregular substructure, the number of outer terminals only increases approximately with the square root from the number of contained gate circuits, and since, accordingly, both the costs and the failure rate per gate circuit decrease as complexity increases, the general trend of development is towards continuously more voluminous and, consequently, more complex integrated circuits. In English-language literature, such types of circuits are referred to as VLSI (very large scale integrated) circuits.

According to an article published on pages 65 and 66 of "Electronics", Dec. 8, 1977, one of the main problems of such large scale integrated circuits resides in testing the circuits following the manufacture. This not only applies to digital functional testing (in digital circuits), but also to parameter testing in preventing drift failures (in digital circuits and also in linear circuits). Moreover, it is mentioned in the aforementioned article that test patterns for the digital functional testing increase in their complexity exponentially as the number of gate circuits of the complex to be tested increases, unless additional test points are introduced. This leads to the fact that a considerable amount of the possible failures is not at all detected by the functional testing patterns. Therefore, the introduction of a large number of test points may substantially increase the failure-detection rate.

This, however, does not yet solve the problem of the aforementioned hidden failures. These failures (errors) may be caused in that circuit elements, such as gate or flip flop circuits, may be just on the verge of the functionability and, in the event of a small parametric deviation of a circuit element, might become completely unserviceable without this being able to be recognized owing to the non-linearities of the preceding and subsequently following circuit elements, in the course of measurements carried out at the outer terminals. Also failures of this kind can be recognized with the aid of suitable test points, the number of which, however, must be a considerable one for this purpose.

Considering that the test points which are to be provided additionally, are circuit points within the circuit of the VLSI circuit, these test points, in order to become electrically accessible at all, must be led at least to connecting pads provided for on the rim of the semiconducting crystal. From this fact there immediately results a substantial restriction of the number, because the marginal length of a semi-conducting crystal is limited, and in most cases these marginal areas are also already required for and occupied by the connection pads necessary for the operation. Moreover, the same consideration also applies to the outer terminals of the finished VLSI circuit is housed in a casing.

SUMMARY OF THE INVENTION

According to this invention there is provided a monolithically very large scale integrated circuit (VLSI) having any arbitrarily given substructure, and comprising the outer terminals necessary for the operation, wherein the improvement comprises that an internal test circuit merely requiring one, two or three additional outer terminals (pads) is integrated as well.

It is the object of the invention as characterized in the claims, therefore, to design VLSI circuits in such a way that they will become suitable for being tested by requiring a minimum investment in additional outer terminals, but with an arbitrarily high accuracy.

BRIEF DESCRIPTION OF THE DRAWINGS

The invention will now be explained in greater detail with reference to FIGS. 1 to 8 of the accompanying drawings, in which.

DETAILED DESCRIPTION OF THE PREFERRED EMBODIMENTS

Figure 1:
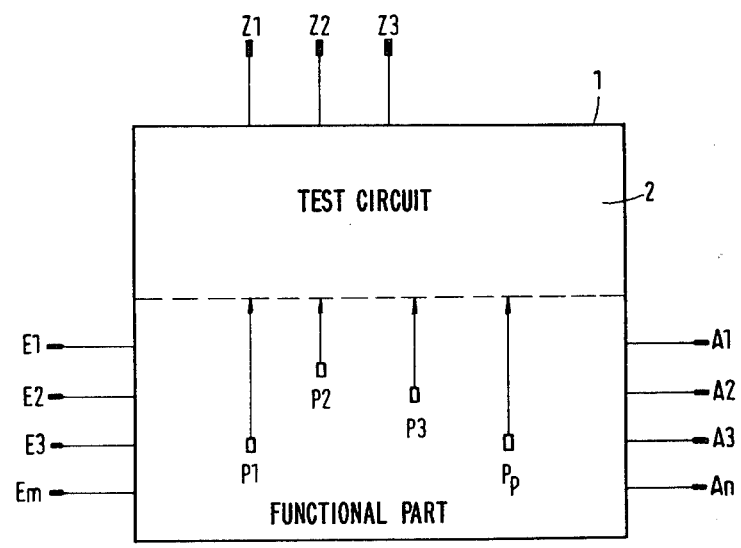
FIG. 1 schematically shows the basic structure of a VLSI circuit according to the invention, FIG. 2 schematically shows the structure of a VLSI circuit by way of a first design layout of the invention, FIG. 3 schematically shows the structure of a VLSI circuit by way of a second design layout of the invention, FIG. 4 schematically shows the structure of a VLSI circuit by way of a third design layout of the invention, FIG. 5 schematically shows a modification of the arrangement according to FIG. 2, comprising a shift register instead of the counter and the combinational circuit, FIG. 6 schematically shows a further embodiment of the arrangement according to FIG. 2 and an operating circuit therefor.

FIG. 1 schematically shows the basic idea of the invention. Thus, the reference numeral 1 referring to shown rectangle, indicates the VLSI circuit. The horizontal dashline separates the test circuit 2 as contained therein, from its functional part. The internal structure of the functional part is not shown, because it may have any suitable and conceivable form and, moreover, is of no importance to the basic idea of the invention. Incidentally, of importance there is merely the fact that the functional part cannot be tested sufficiently, as already mentioned hereinbefore, via its outer terminals E1, E2, E3 ... Em (input terminals) and A1, A2, A3 ... An (output terminals). The functional part of the VLSI circuit 1 may thus, for example, be a pure digital circuit which can be preferably realized in accordance with the known technique of employing insulated-gate field-effect transistors, or else with the aid of the well-known so-called integrated injection logic (I²L) technique. The functional part, however, may also be an integrated analog circuit, for example, a partial circuit of radio or television receivers, which is than realized advantageously by employing the technique of the well-known bipolar circuits. It is also suitable, of course, to employ any other combination of the nowadays customarily used realization techniques for obtaining integrated circuits, especially also a combination of digital and analog circuits.

Moreover, it is essential with respect to the basic idea of the invention, that test points P1, P2, P3 ... Pp are provided for in the functional part, with these test points being electrically connected to the test circuit 2. Finally, it is still essential with respect to the test circuit 2 that it, quite depending on the design layout and control varieties, merely comprises one, two or three outer terminals Z1, Z2, Z3. The test points P1 ... Pp themselves may serve, in the course of the testing, either the feeding in of signals, e.g. for the setting of flip flop circuits, as signal outputs, if necessary with subsequently arranged amplifiers, for the measuring of static and/or dynamic circuit element parameters, hence, e.g. for measuring current-voltage characteristics, or some digital supervisory purposes, hence, e.g. for detecting whether signals either exceed or fall short of a predetermined threshold value.

Figure 2:
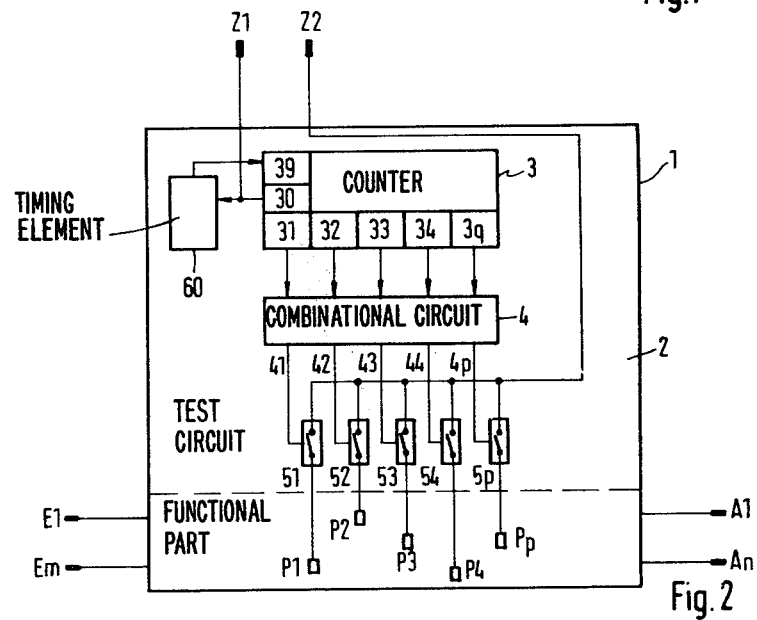

FIG. 2 schematically shows the structure of a first variant form of embodiment of the invention, wherein the test circuit 2 in an advantageous manner has the structure as shown. Substantial constituent parts of the test circuit are the counter 3, the combinational circuit 4, and the selection switches 51, 52, 53, 54 ... 5p. For use as the counters 3, there may be used any of the known types of counters, with the choice of a certain type of counter depending on the specific circumstances. Thus, for example, when realizing the functional part of a VLSI circuit in accordance with the aforementioned field-effect transistor technique, also the entire test circuit will have to be realized in accordance with this technique and, consequently, there will have to be chosen types of counters which offer a particular advantage when designed in accordance with the field-effect transistor technique, such as e.g. Johnson ring or chain counters. The same considerations also apply to the combinational circuit 1 and to the selection switches 51 ... 5p.

The counter reading outputs 31, 32, 33, 34 ... 3q are in such a way combined with the aid of combinational circuit 4 that via the outputs 41, 42, 43, 44 ... 4p thereof, the selection switches 51 ... 5p are accordingly activated sequentially. In the example of embodiment shown in FIG. 2 the selection switches 51 ... 5p are all shown to be normally open contacts which, of course, are realized in the form of electronic switches. Via the selection switches 51 ... 5p the test points P1 ... Pp of the functional part of the VLSI circuit 1 are connected to the common line leading to the second additional terminal Z2. Since, to the counting input 30 of the counter 3 and via the first additional terminal 1, there is applied a signal to be counted, hence, e.g. a pulse sequence coming from an external clock pulse generator, the test points P1 ... Pp are connected in the order of sequence as provided for by the combinational circuit 4 and determined by the intended test pattern, to the second additional terminal Z2 to which a suitable measuring instrument is applied.

Moreover, FIG. 2 still shows a variant form of the control circuit. It contains the timing element 60 which is connected to the reset input 39 of the counter 3. This timing element 60, in turn, is controlled via the first additional terminal Z1 and, for example, may be a monostable flip flop which only releases the reset input 39 in the event of pulses being applied to the first additional terminal Z1, i.e. does not activate the input 39. In this way it can be achieved that the counter 3 is reset, and the selection switches 51 ... 5p are opened when no signal is applied to the first additional terminal Z1. If necessary, and for achieving an improved suppression of functional disturbances which, via the test circuit 2, might enter into the functional part of the VLSI circuit, a decoding device for decoding a certain predetermined code word, may still be arranged ahead of the counting input 30 of the counter 3, with this coding device only permitting such pulses to enter the counter 3 which are to be counted in the presence of this particular code word.

A further variant form of this control circuit will result whenever pulses are applied to the first additional terminal Z1, and when subsequently thereto, the potential thereof is retained for periods longer than the pulse duration thereof, at a high value H or at a low value L, with a resetting of the counter only being effected in the case of a low value L.

In the second design layout of the invention shown in FIG. 3, the test circuit again consists of the three parts: counter 3, combinational circuit 4, and selection switches 51 ... 5p, with p in FIG. 3 equalling 4. Compared with the variant form according to FIG. 2, the test points P1 ... P4, with the aid of the selection switches 51 ... 54 are applied to the already existing outer terminal A1 of the VLSI citcuit 1 and, in turn, are sequentially controlled by the combinational circuit 4 via the output lines 41 ... 44 thereof.

Figure 3:
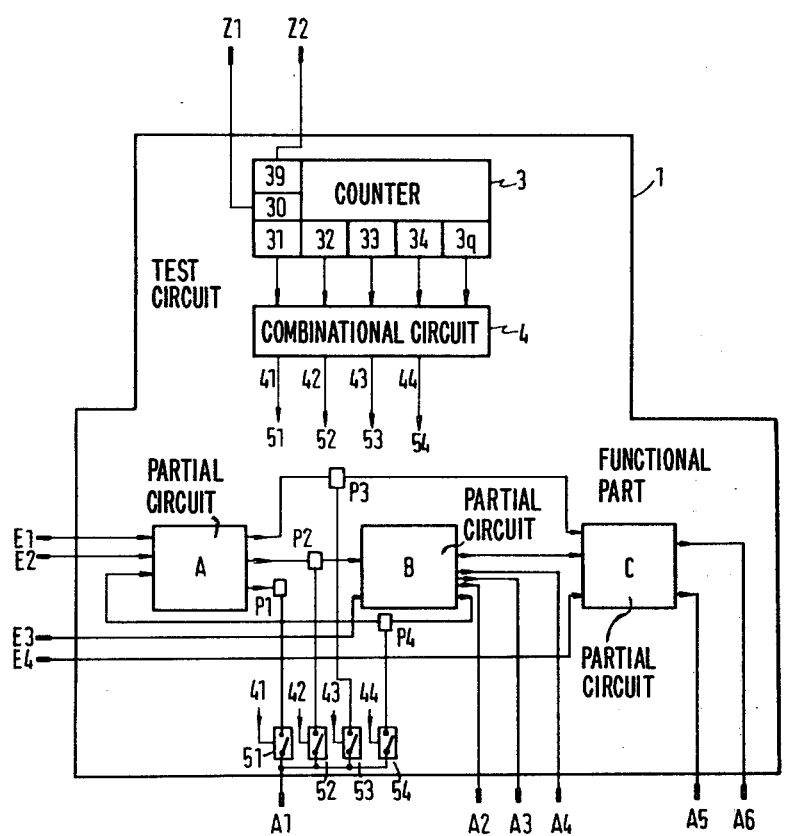

The functional part of the VLSI circuit 1, in the design layout according to FIG. 3, consists of the partial circuits A, B, C which are connected to one another and to the input terminals E1 ... E4, as well as to the output terminals A1 ... A6 via the solid-line connections, while the connections extending from the test points P1 ... P4 to the selection switches 51 ... 54 and to the outputs 41 ... 44 of the combinational circuit 4 are indicated by the thin lines. As that particular output terminal to which the test points P1 ... P4 are sequentially connected through, there is chosen such a terminal, namely the output terminal A1, which is not permanently required for the testing operation.

There has also been chosen a further variant form of the control circuit. While in the variant form according to FIG. 2, the test points P1 ... Pp are capable of being sequentially interrogated via the second additional terminal Z2, it is made possible by the variant form according to FIG. 3 to operate again the counting input 30 of the counter 3 via the first additional terminal Z1 and to operate the reset input 39 thereof via the second additional terminal Z2.

Figure 4:
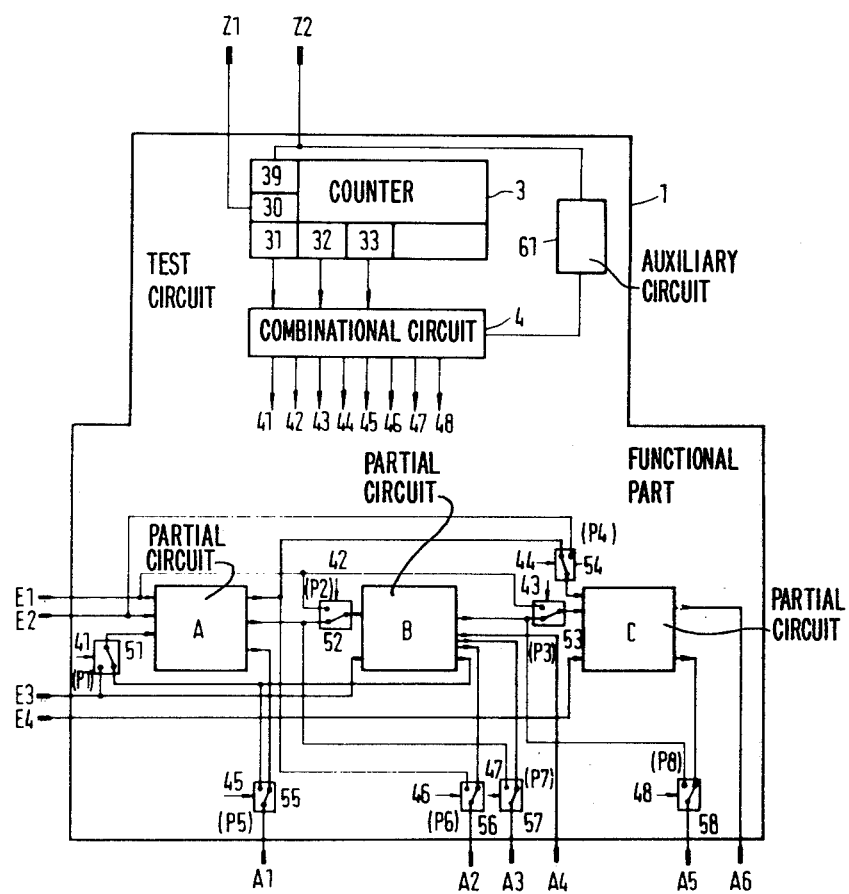

Finally, the variant form of FIG. 4 shows that according to the invention, it is also possible to check partial circuits of the functional part of the VLSI circuit 1 with respect to their functionability. For this purpose, there are again used the counter 3 and the combinational circuit 4 as well as a corresponding number of selection switches, i.e. in FIG. 4 the selection switches 51 ... 58. Unlike in the other variant forms, however, these switches are now electronic changeover switches, which are actuated by the outputs 41 ... 48 of the combinational circuit 4 in a way still to be described hereinafter. The combinational circuit 4, which for example, may be realized in the form of a read-only memory (ROM) is programmed in such a way that the selection switches 51 ... 58, in the zero position of the counter 3, will assume the position as shown, i.e. the partial circuits A, B, C are interconnected to one another in accordance with the solid-line connections, as well as to the input terminals E1 . . . E4 and to the output terminals A1 . . . A6.

In the first position 31 of the counter 3, unlike in the zero position, the selection switches 51, 56, 57 are switched over. Owing to this, the partial circuit A, via both the input terminals E1, E2, E3 and the output terminals A1, A2, A3, can be tested separately from the remaining circuit. In the second position 32 of the counter 3, unlike in the zero position, the selection switches 52, 55, 58 are switched over, so that now the partial circuit B becomes capable of being tested separately via both the input terminals E1, E3 and the output terminals A1 . . . A5. Finally, in the third position 33 of the counter 3, the selection switches 53, 54 are switched over so that now, via both the input terminals E1, E2, E4 and the output terminals A5, A6, the partial circuit C becomes capable of being tested separately.

Since, as a rule, it is now practical for economical reasons, to test all of the necessary partial circuits separately, a considerable reduction of the testing time can be achieved by combining the variant forms according to FIGS. 3 and 4 with one another, i.e. in that the switching over to outer terminals, and the sequential through-connection to outer terminals is carried out in common.

In the design layout according to FIG. 4, there is shown a further variant form of the control circuit. For this purpose there is integrated as well as auxiliary circuit 61 which, after the counter 3 has passed through all of its positions, transmits a pulse on the line extending to the reset input 39, at which point it may be taken off, i.e. via the second additional terminal Z2, and can be used for testing the unobjectionable functioning of the counter 3.

In the design layouts according to FIGS. 3 and 4 it is sufficient to provide one additional terminal Z1 only, when combining it with the control circuit as is shown in FIG. 2.

There are also cases, however, in which all three additional terminals may be required.

Figure 5:
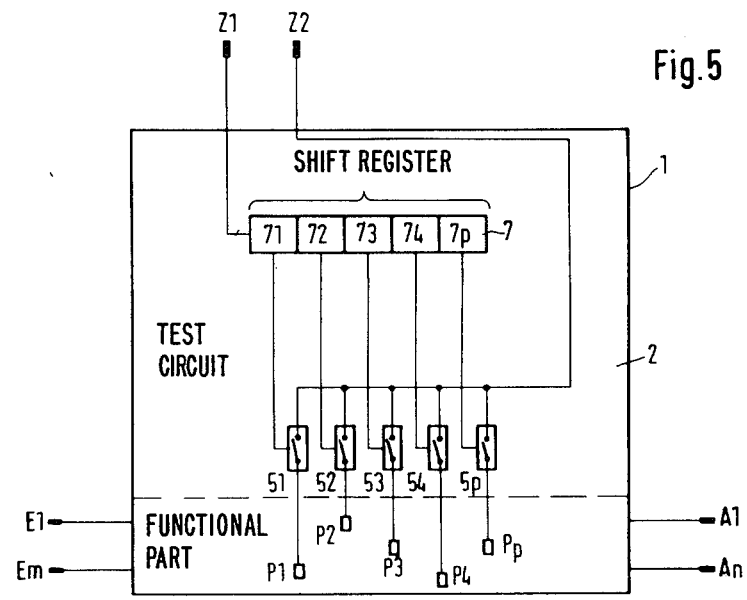

FIG. 5 schematically shows a modification of the arrangements as shown in FIGS. 2, 3, or 4 and which, in a certain way, represents a simplification of the arrangements shown in FIGS. 2, 3 or 4.

Instead of the counter 3 and the combinational circuit 4, there is provided the shift register 7 whose parallel outputs 71, 72, 73, 74 . . . 7p control the selection switches 51 . . . 5p directly, hence without the interconnection of a combinational circuit. Moreover, these selection switches are associated with the test points P1 . . . Pp and the second additional terminal Z2 in the same way as in the arrangement according to FIG. 2.

Figure 6:
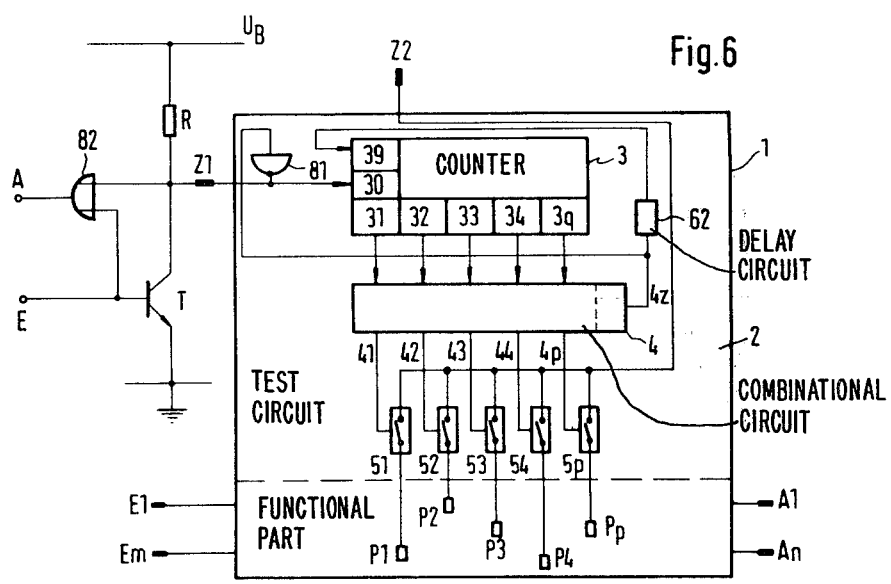

FIG. 6 schematically shows a further embodiment of the arrangement according to FIG. 4, as well as an operating circuit suitable therefor. Essentially, further embodiment with respect to the arrangement as shown in FIG. 4, resides in that the delay circuit 62 applies the pulse as generated in the additional stage 4z of the combinational circuit 4, in a delayed manner to the reset input 39 of the counter 3. Moreover, the pulse of the additional stage 4z is applied to the input of the inverter 81 whose output is applied to the first additional terminal Z1.

Figure 7:
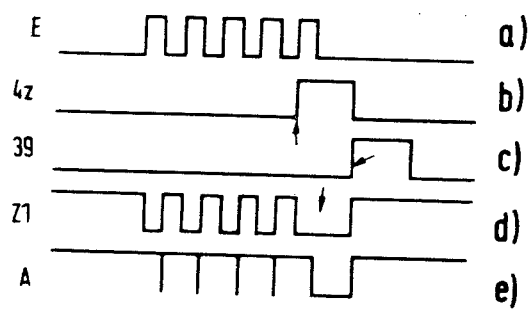
FIG. 7 shows various pulse diagrams relating to the arrangement according to FIG. 6, and FIG. 8 schematically shows another further embodiment of the arrangement according to FIG. 2.

The operating circuit which, of course, is connected from the outside to the VLSI circuit 1 consists of the transistor T which is applied with its emitter to the zero point of the circuit, with the collector of the transistor T being applied to the first additional terminal Z and, across the resistor R, to the supply voltage $U_B$. Both the collector and the base of the transistor T are each applied to one of the two inputs of the OR-gate 82, whose output is connected to the output A of the operating circuit, while the base of transistor T forms the input E thereof, for the pulses (cf. FIG. 7a).

The combinational circuit 4 is now in such a way enlarged by the additional stage 4z, that it, in a defined position of the counter 3, and after having passed through the positions serving the testing on the output line, will deliver a pulse (cf. FIG. 7b). This pulse appears invertedly at the first additional terminal Z1 (cf. FIG. 7d) and, following the time delay of the delay circuit 62, as a pulse at the reset input 39 (cf. FIG. 7c), so that the counter is returned to its zero position, thus causing the pulse to disappear again at the output of the additional stage 4z (cf. FIG. 7b).

The inverter 81 lying between the reset input 39 and the additional terminal Z1, together with the transistor T applied to the additional terminal Z1 by the outer operating circuit, forms a so-called wired NOR gate (wired NOR). Accordingly, at the output of the OR-gate 82 and, consequently, at the output A of the operating circuit, there will thus appear only in the defined position of the counter 3, a pulse which is widened with respect to the needle pulses otherwise appearing at the output A, whose tailing edge may be regarded as an information concerning the effected counter resetting (cf. FIG. 7e). Moreover, the signal apearing at the output A of the operating circuit, permits to check the proper functioning of the test circuit 2 itself.

Figure 8:
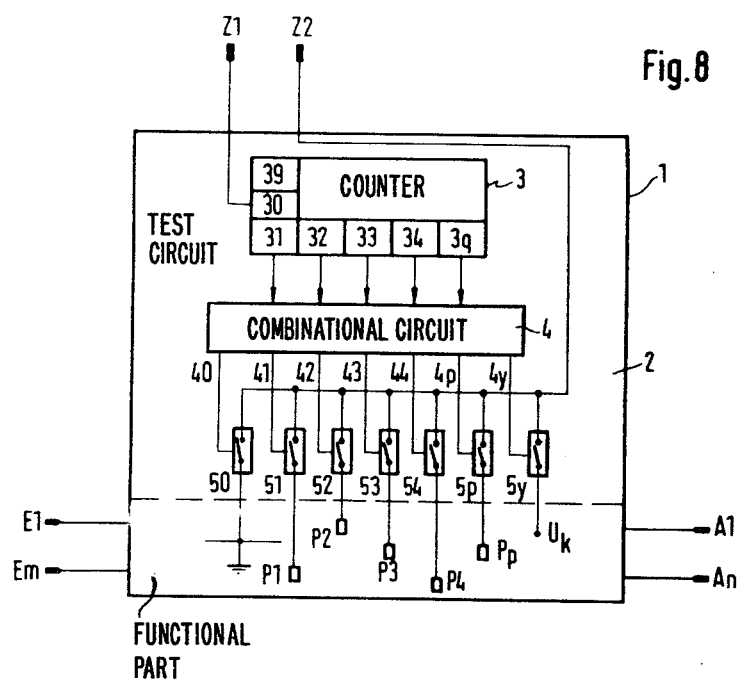

FIG. 8 shows another modification of the arrangement according to FIG. 2 producing at the second additional terminal Z2 a signal from which the zero setting of the counter 3 can be recognized, as well as also a signal which, following a predetermined number of pulses at the counter 3, shows to have a predetermined amplitude. In this way it is possible to ascertain the unobjectionable functioning of the test circuit 2 as well as the resetting of the counter 3 to zero, without an independent reset signal for the counter 3 having to be produced.

In FIG. 8, therefore, the reset input 39 is shown to be not wired. Therefore, if so required, it may also be dispensed with completely, or else it is possible to use counting circuits which are not provided with a reset input. The number of selection switches has been enlarged by the two additional selection switches 50, 5y which, with their one switch terminal, are applied to the common line extending to the second additional terminal Z2. The other switch terminal of the first additional selection switch 50 is applied to the zero point of the circuit, while the corresponding terminal of the second additional selection switch 5y is applied to a constant voltage $U_k$ produced within the VLSI circuit 1. The amplitude of this voltage $U_k$ is appropriately chosen thus as to be not identical with any of the voltages to be expected at the test points P1 . . . Pp, in order thus to avoid mistakes with any of these voltages. The two additional section switches 50, 5y are opened and closed via the additional outputs 40, 4y of the combinational circuit 4.

The modifications of the arrangements as shown in FIGS. 5 to 8, of course, may also be employed with the examples of embodiment and further embodiments as shown in FIGS. 2 to 4. This applies especially to the shift register according to FIG. 5, which may replace the counter 3 and the combinational circuit 4.

What is claimed is:

1. A monolithic very large scale integrated circuit (VLSI) including an operating portion having a plurality of outer terminals and a plurality of test points, and a testing portion integrated with the operating portion and operative for testing the latter in response to an input signal, said testing portion comprising:
- at least one and at most three additional terminals at least one of which is an input terminal of the testing portion;
- means for generating a test signal in response to the application of the input signal to said input terminal;
- means for monitoring the test points of the operating portion in dependence of the test signal; and
- means for providing an output signal containing circuit defect information in response to detection of failure at any one of the test points.

2. The VLSI circuit as claimed in claim 1, wherein said test signal generating means includes a counter having an input connected to said input terminal and a plurality of reading outputs, and a combined circuit connected to said reading outputs; and wherein said monitoring means includes a plurality of selection switches respectively associated with said test points and controlled by said combination circuit.

3. The VLSI circuit as claimed in claim 2, whererin said additional terminals include at least one output terminal; wherein said selection switches are interposed between the respective test points and said output terminal; and wherein said combination circuit is operative to sequentially operate said selection switches for connecting the respective test points to said output terminals.

4. The VLSI circuit as claimed in claim 2, wherein the outer terminals of the operating portion include output terminals; wherein said selection switches are interposed between the respective test points and at least some of the output termnals; and wherein the combination circuit is operative to operate said selection switches for connecting the respective test points to said some output terminals.

5. The VLSI circuit as claimed in claim 1, wherein said test signal generating means includes a shift register having an input connected to said input terminal and a plurality of outputs; and wherein said monitoring means includes a plurality of selection switches respectively connected with said test points and controlled by said shift register outputs.

6. The VLSI circuit as claimed in claim 4, wherein said selection switches are inserted as changeover switches into the lines of the test points, and that via said selection switches partial circuit of said VLSI circuits are applied to at least some of said outer terminals.

7. The VLSI circuit as claimed in claim 2 wherein a likewise integrated timing element which is controlled from the input terminal is connected to the reset input of the monitoring means.

8. The VLSI circuit as claimed in claim 2 wherein an auxiliary circuit is integrated as well and which, after the counter has passed through all of its counting positions, transmits a pulse to the reset line, which is capable of being measured on this line.

9. The VLSI circuit as claimed in claim 2, wherein said testing portion contains a shift register by whose parallel outputs the said selection switches are controlled, which are connected to said test points.

10. The VLSI circuit as claimed in claim 7 or 5 wherein said timing element is a delay circuit, that said combinational circuit is enlarged by one additional stage which, at a predetermined reading of said monitoring means after each passage through the test positions, transmits a pulse, which, via said delay circuit, is fed to the reset input and, via an inverter, to said input terminal.

11. An operating circuit for the VLSI-circuit as claimed in claim 9, wherein to said input terminal there is connected the collector of a transistor whose emitter is applied to the zero point of the circuit, as well as the first input of an OR-gate, that to the base of said transistor there is applied for one pulse train the second input of said OR-gate and the input of said operating circuit, and that the output of said OR-gate is the output of said operating circuit.

12. The VLSI circuit as claimed in claim 2 or 5, wherein there are provided two additional selection switches applied to another of said additional terminals the first one being connected to the zero point of the circuit, while the second one is applied to a constant voltage produced within said VLSI-circuit.

* * * * *